(12) United States Patent  
Cyrusian et al.

(10) Patent No.: US 9,088,273 B2  
(45) Date of Patent: Jul. 21, 2015

(54) ADAPTIVELY INTERPOLATING AND SEARCHING TO REFINE SAMPLING IN PULSE WIDTH MODULATION

(71) Applicant: MARVELL WORLD TRADE LTD, St. Michael (BB)

(72) Inventors: Sasan Cyrusian, Scotts Valley, CA (US); Zining Wu, Los Altos, CA (US); Kapil Jain, Santa Clara, CA (US)

(73) Assignee: MARVELL WORLD TRADE LTD. (BB)

( * ) Notice: Subject to any disclaimer, the term of this patent is extended or adjusted under 35 U.S.C. 154(b) by 27 days.

(21) Appl. No.: 13/781,924

(22) Filed: Mar. 1, 2013

(65) Prior Publication Data

US 2013/0243073 A1   Sep. 19, 2013

Related U.S. Application Data

(60) Provisional application No. 61/610,749, filed on Mar. 14, 2012.

(51) Int. Cl.  
*H03K 9/08* (2006.01)  
*H03K 7/08* (2006.01)

(52) U.S. Cl.  
CPC ...................... *H03K 7/08* (2013.01)

(58) Field of Classification Search  
USPC ................................................ 375/23–240  
See application file for complete search history.

(56) References Cited

U.S. PATENT DOCUMENTS

| | | | |
|---|---|---|---|
| 6,473,457 B1 * | 10/2002 | Pascual et al. | 375/238 |
| 7,224,728 B2 * | 5/2007 | Komamura | 375/238 |
| 8,315,302 B2 * | 11/2012 | Lewis | 375/238 |
| 2008/0116985 A1 * | 5/2008 | Pedersen et al. | 332/109 |

* cited by examiner

*Primary Examiner* — Emmanuel Bayard (57) ABSTRACT

Systems, methods, and other embodiments associated with estimating a natural sampling point from uniform sample points when generating a PWM signal are described. According to one embodiment, an apparatus includes a cross point logic configured to determine which of the samples along the analog signal are adjacent to a crossing point of a reference signal and the analog signal by identifying samples between which the crossing point occurs. The apparatus includes an interpolation logic configured to adaptively interpolate points along the analog signal that approach the crossing point by using the samples. The interpolation logic is configured to adaptively interpolate the points to refine a region between the points within which the crossing point occurs. The apparatus includes a search logic configured to search within the region to produce an estimated location of the crossing point by using the interpolated points.

20 Claims, 8 Drawing Sheets

ADAPTIVELY INTERPOLATING AND SEARCHING TO REFINE SAMPLING IN PULSE WIDTH MODULATION

CROSS REFERENCE TO RELATED APPLICATIONS

This patent disclosure claims the benefit of U.S. provisional application Ser. No. 61/610,749 filed on Mar. 14, 2012, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Pulse-width modulation (PWM) refers to a technique of generating a signal by a digital device. For example, the digital device may iteratively vary or modulate a duty cycle of a square wave in order to approximate an analog signal. PWM is, in general, an efficient way of producing a signal that avoids, for example, excessive power loss. Furthermore, different techniques may be used to generate a PWM signal. However, each technique may suffer from different difficulties, such as interference or reduced accuracy.

SUMMARY

In general, in one aspect this specification discloses an apparatus for generating a pulse width modulation (PWM) signal using samples of an analog signal. The apparatus includes a cross point logic configured to determine which of the samples along the analog signal are adjacent to a crossing point of a reference signal and the analog signal by identifying samples between which the crossing point occurs. The crossing point is a point where the analog signal intersects the reference signal. The apparatus includes an interpolation logic configured to adaptively interpolate points along the analog signal that approach the crossing point by using the samples. The interpolation logic is configured to adaptively interpolate the points to refine a region between the points within which the crossing point occurs. The apparatus includes a search logic configured to search within the region to produce an estimated location of the crossing point by using the interpolated points. The apparatus includes a signal generator configured to generate a pulse in a pulse train of the PWM signal as a function of the estimated location of the crossing point.

In another embodiment, the signal generator is configured to generate the pulse by generating the pulse with a width that is based on the estimated location of the crossing point.

In another embodiment, the search logic is configured to search the region using a binary search algorithm to produce the estimated location. The search logic is configured to search the region by using the binary search algorithm to search within the region until the estimate of the location satisfies a predetermined condition. The predetermined condition defines a number of iterations for the binary search algorithm.

In general, in another aspect, this specification discloses a method for generating a pulse width modulation (PWM) signal using samples of an analog signal. The method includes determining, by a signal processor, which of the samples along the analog signal are adjacent to a crossing point of a reference signal and the analog signal by identifying samples between which the crossing point occurs. The crossing point is a point where the analog signal intersects the reference signal. The method includes adaptively interpolating points along the analog signal that approach the crossing point by using the samples. Adaptively interpolating the points refines a region between the points within which the crossing point occurs. The method includes searching within the region to produce an estimated location of the crossing point by using the interpolated points. The method includes generating a pulse in a pulse train of the PWM signal as a function of the estimated location of the crossing point.

In general, in another aspect, this specification discloses a non-transitory computer-readable medium that when executed by a computer cause the computer to perform a method. The method includes analyzing samples of an analog signal. The method includes adaptively interpolating, by a signal processor, in the computer, points along the analog signal that approach a crossing point. Adaptively interpolating the points uses samples that are adjacent to a reference signal along the analog signal to refine a region between the points within which the crossing point occurs. The crossing point is a point where the analog signal intersects the reference signal. The method includes searching within the region to produce an estimated location of the crossing point by using the interpolated points.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Described herein are examples of systems, methods, and other embodiments associated with estimating a natural sampling point to generate a pulse of a PWM signal. The natural sampling point (also referred to as NASP) is a point where an analog input signal intersects or crosses a reference signal. That is, when the analog signal and reference signal are plotted together on a graph, the NASP is the point where the two signals have the same value, and thus intersect. The NASP is used by natural sampling pulse width modulation (NPWM) to determine a width of a pulse in a PWM signal. However, NPWM uses the continuous analog signal, not just samples, in order to identify the NASP. Thus, to perform NPWM the continuous analog signal needs to be available. Additionally, NPWM suffers from difficulties with intermodulation spectral distortion.

Another technique for sampling in PWM is uniform sampling pulse-width modulation (UPWM). UPWM uses discrete samples of the analog signal instead of the continuous analog signal. However, the discrete samples do not always provide an accurate approximation of the NASP. Accordingly, UPWM is not as accurate and suffers from difficulties with in-band harmonic distortion. Thus, in one embodiment, a signal processor is configured to use discrete samples of the analog signal to estimate the NASP. In this way, the signal processor can determine a more accurate representation of the NASP without using the continuous analog signal and also avoids difficulties with intermodulation spectral distortion and in-band harmonic distortion.

Figure 1:
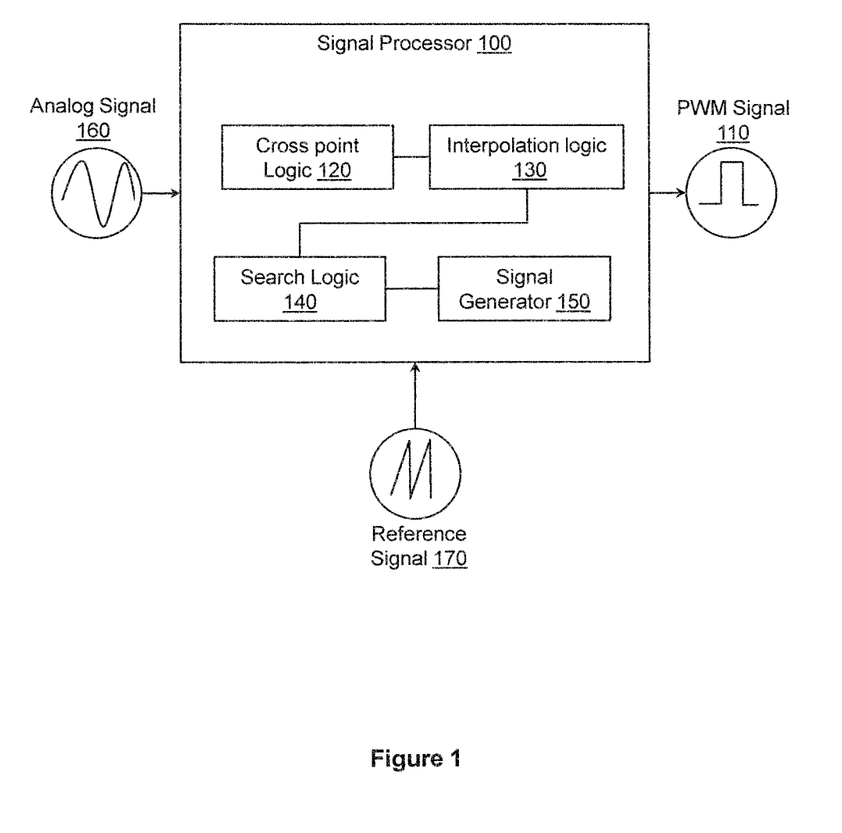
FIG. 1 illustrates one embodiment of a signal processor associated with estimating a natural sampling point from uniform sample points when generating a PWM signal.

With reference to FIG. 1, one embodiment of a signal processor 100 is shown that is associated with estimating a natural sampling point (NASP) when generating pulses in a PWM signal 110. The signal processor 100 includes cross point logic 120, interpolation logic 130, search logic 140, and a signal generator 150. The signal processor 100 receives an analog signal 160 and a reference signal 170 as input.

The analog signal 160 is, for example, an audio signal, control signal, or another analog signal that is to be converted to a digital form using pulse-width modulation (PWM). The reference signal 170 is a triangular waveform or saw tooth carrier waveform that is periodic and reoccurring, and is used by the signal processor 100 as a reference value when determining a value of the analog signal 160. While the analog signal 160 and the reference signal 170 are discussed as inputs to the signal processor 100, continuous values of the signals 160 and 170 are not used by the signal processor 100. Instead, in one embodiment, the cross point logic 120 is configured to sample the signals 160 and 170 at discrete points in time. In this way, the signal processor 100 does not use buffer/storage space for the whole signals 160 and 170, but only the samples.

The samples are, for example, discrete points along one or both of the signals 160 and 170 that are represented by an amplitude value (e.g., volts or decibels). The samples can be normalized in order to compare the two signals 160 and 170 on a plot.

In one embodiment, the cross point logic 120 is configured to use the samples of the analog signal 160 to determine a likely location of a crossing point. The crossing point is a point where the analog signal 160 intersects the reference signal 170. That is, the cross point logic 120 determines which of the samples along the analog signal 160 are adjacent to the crossing point. For example, the cross point logic 120 identifies two samples that are adjacent to the reference signal 170 on either side. The cross point logic 120 iteratively subtracts a value of each sample of the analog signal 160 from a value of each corresponding sample of the reference signal 170. In general, corresponding samples are those samples taken at a same discrete time. When the cross point logic 120 identifies a change in polarity between results, then the two adjacent samples have been identified (e.g., subtracting two previous samples provides a positive value while subtracting two current samples provides a negative value). The change in polarity indicates that the signals 160 and 170 have crossed and thus the crossing point occurs between the two samples. By locating the two samples of the analog signal 160 that are adjacent to reference signal 170, the cross point logic 120 narrows a region in which to interpolate values and search for the crossing point.

For example, once the two adjacent samples are identified the interpolation logic 130 is configured to interpolate points along the analog signal 160 that approach the crossing point. The interpolation logic 130 uses the two samples identified by the cross point logic 120 as a starting point for interpolating. Accordingly, the interpolation logic 130 produces additional points along the analog signal 160 that are closer to the crossing point than the original samples of the analog signal 160. In one embodiment, the interpolation logic 130 is configured to iteratively interpolate points along the analog signal 160 in multiple rounds until, for example, the interpolated points satisfy a predetermined condition (e.g., are within a certain range of the crossing point, or having performed a predetermined number of interpolations). In this way, the interpolation logic 130 is configured to interpolate the points to refine a region between the points within which the crossing point occurs.

The interpolation logic 130 can be configured to use different algorithms to interpolate the points. For example, the interpolation logic 130 can be configured to interpolate using Lagrange interpolation, Hermite interpolation, linear interpolation, cubic spline interpolation, and so on.

After the interpolation logic 130 has interpolated the points, the search logic 140 is configured to search within the refined region defined by the interpolated points. Consequently, the search logic 130 can focus a search on the refined region and therefore produce a more accurate estimate of a location of the crossing point. For example, the search logic 140 is configured to perform a binary search or other search within the region bounded by the interpolated points to produce the estimated location of the crossing point. Accordingly, the search logic 140 is not, for example, searching within an entire period of the reference signal 170, but only the refined region which is limited to a space nearest to the crossing point.

In this way, the search logic 140 produces an accurate estimate of the location of the crossing point by using the uniform discrete samples of the analog signal 160. However, the signal processor 100 avoids difficulties encountered by other methods that use discrete samples by, for example, refining the samples to further estimate the location of the crossing point to produce the PWM signal 110, thus, using a point that closely approximates the NASP.

Once the search logic 140 produces the estimate of the location of the crossing point (i.e., the NASP), the signal generator 150 generates a pulse in a pulse train of the PWM signal 110 as a function of the estimated location of the crossing point. That is, the signal generator 150 generates the pulse with a width that is based on the estimated location of the crossing point. For example, consider that the reference signal 170 is a constantly repeating signal with a positive slope. From a beginning point of each period of the reference signal 170, the reference signal gradually increases in value. Eventually, the analog signal 160 intersects the reference signal 170 at the crossing point, which is a distance D (in units of time) from the beginning point of a given period of the reference signal 170. The signal generator 150 is configured to generate the pulse with a width (e.g., a duty cycle) that is, for example, equal to the distance D.

In one embodiment, the signal generator 150 generates the pulse according to a 3-level PWM scheme, a leading edge scheme, a trailing edge scheme, a centered edges scheme, or another method of generating pulses of a pulse-width modulation signal. In either case, the signal generator 150 generates pulses in a pulse train of the PWM signal as a function of the estimated locations of the crossing points. Accordingly, the signal processor 100 iteratively estimates crossing points and generates pulses to form the pulse train of the PWM signal 110.

Figure 2:
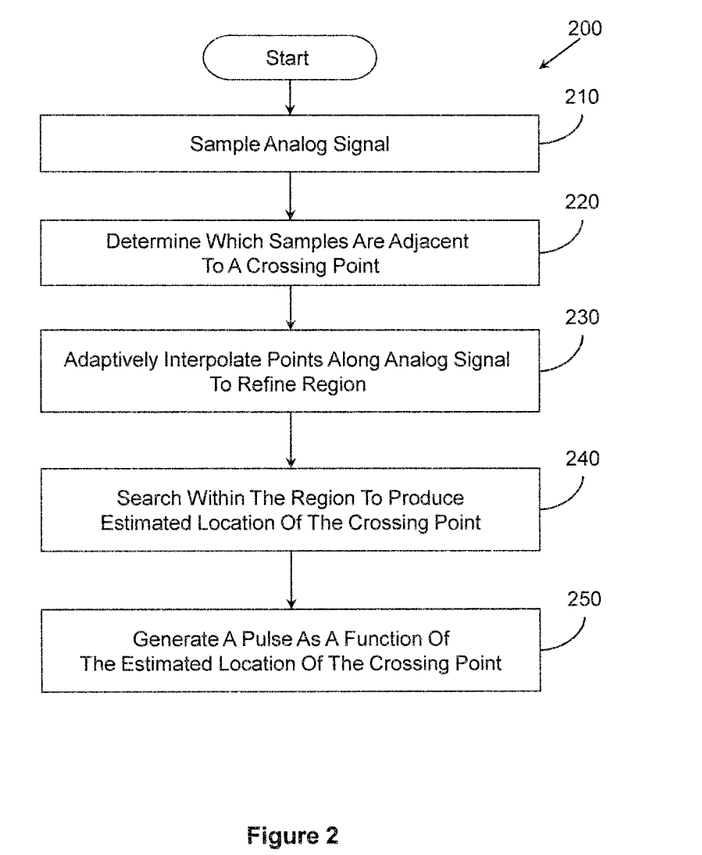
FIG. 2 illustrates one embodiment of a method associated with estimating a natural sampling point from uniform sample points when generating a PWM signal.

Further details of the signal processor 100 and estimating the crossing point will be discussed with relation to FIG. 2. FIG. 2 illustrates a method 200 associated with estimating a natural sampling point (NASP) from uniform sample points when generating a PWM signal. For purposes of this discussion, the method 200 will be discussed from the perspective of the signal processor 100. Additionally, the method 200 will be discussed along with examples illustrated in FIGS. 3-7.

The method 200 begins at 210 when the signal processor 100 samples an analog signal (e.g., the analog signal 160). The samples are discrete samples that occur at uniform periods in time (e.g., every microsecond). The signal processor 100 can also sample a reference signal (e.g., the reference signal 170) using the same uniform period in order to provide samples of the reference signal that correspond in time to samples of the analog signal. In one embodiment, the signal processor 100 stores the samples in buffers to await further processing.

Figure 3:
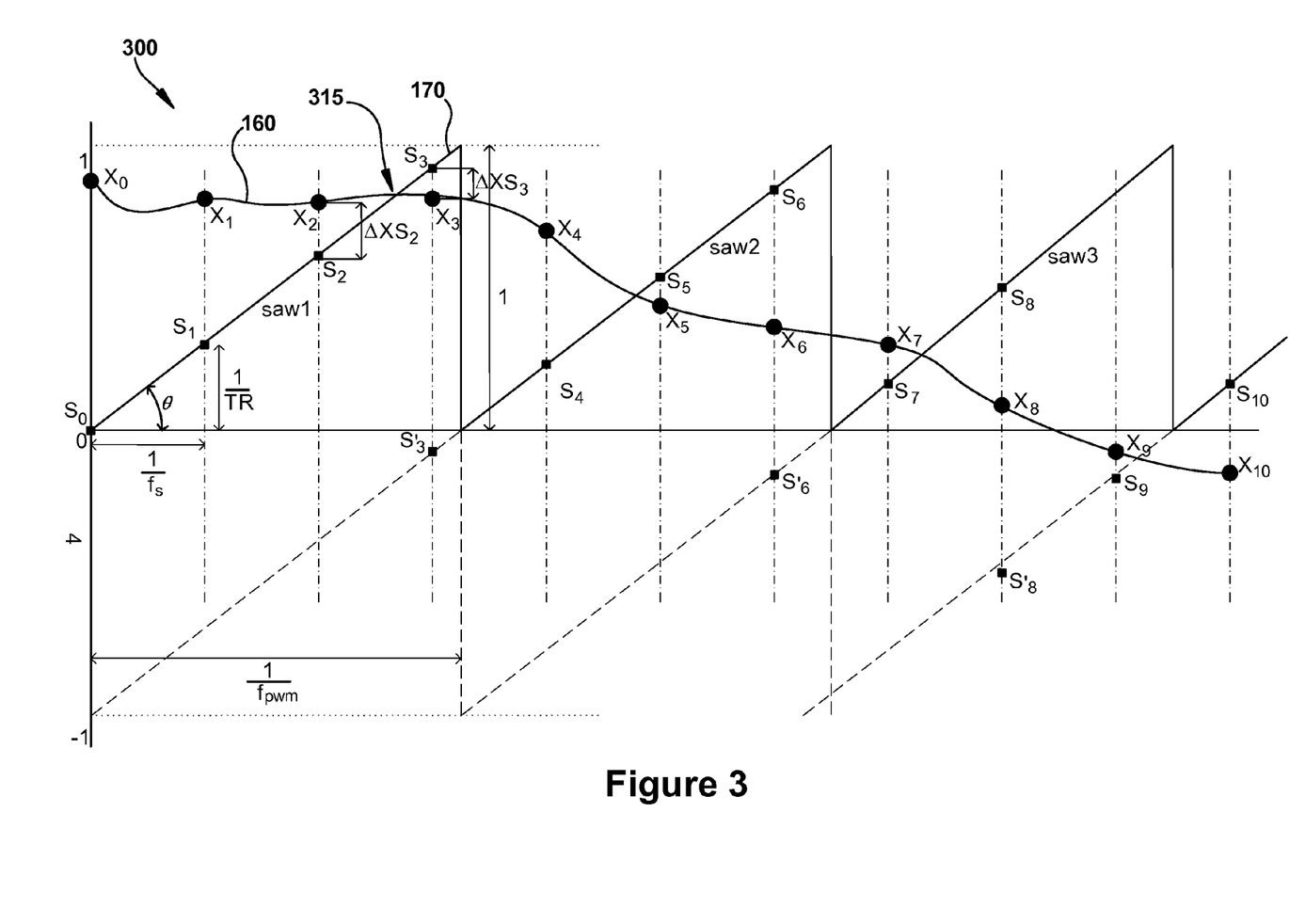
FIG. 3 illustrates one example of identifying samples adjacent to a crossing point illustrated on a plot of an analog signal and a reference signal.

FIG. 3 illustrates a plot 300 of time (x-axis) vs magnitude (y-axis) that includes samples of a reference signal 170 (i.e., $S_0$-$S_{10}$) and samples of an analog signal 160 (i.e., $X_0$-$X_{10}$). As seen in FIG. 3, the samples occur according to a uniform interval for each of the signals. For example, as illustrated in FIG. 3, a sample frequency is $f_s$. FIG. 3 also illustrates a period of the reference signal 170, which is given by $$\frac{1}{f_{pwm}}.$$

$f_{pwm}$ is a frequency of the PWM signal 110. A number of samples per period of the reference signal (TR) can be represented as follows.

$$\tan(\theta) = \frac{1}{1/f_{pwm}} = f_{pwm} \quad (1)$$

$$\tan(\theta) = \frac{1/TR}{1/f_s} = \frac{f_s}{TR} = f_{pwm} \quad (2)$$

$$TR = \frac{f_s}{f_{pwm}} \quad (3)$$

Continuing with FIG. 2 and the method 200, at 220, the signal processor 100 determines which of the samples (from 210) along the analog signal 160 are adjacent to an intersection (i.e., crossing point 315) of the reference signal 170 and the analog signal 160. As an example, further consider FIG. 3. For saw 1, the signal processor 100 begins by comparing $X_0$ and $S_0$ to find $\Delta xs_{ii}$, which is further defined below. For $X_0$ and $S_0$, $\Delta xs_{ii}$ will have a positive value. Accordingly, the signal processor 100 iteratively continues through the samples (e.g., $X_{1...i}$ and $S_{1...i}$) until finding a change in polarity (i.e., a negative value). In FIG. 3, the change in polarity occurs from $X_2$, $S_2$ to $X_3$, $S_3$ since the crossing point 315 occurs between these samples. The change in polarity indicates that the analog signal 160 has crossed over the reference signal 170 since a previous comparison. In this way, the signal processor 100 can identify a general region of the crossing point by identifying two samples (i.e., a left sample and a right sample) between which the crossing point occurs.

The following pseudo code provides an example of how the method 200 may proceed at 220 through comparing the sample points.

```
For ii= 0:end
    Δ xs_ii = x_i - s_i
    s_ii+1 = s_ii + 1/TR
    If (polarity (Δsx_ii) == -1
        Cross point found.
        Cross_point_left=ii-1
        Cross_point_right=ii
        S_ii' = S_ii-1
        S_ii = S_ii')
    end
end
```

Continuing with the method 200 of FIG. 2, at 230 the signal processor 100 adaptively interpolates (e.g., adaptively upsamples) points along the analog signal 160 that approach the crossing point 315. The signal processor 100 uses, for example, the two samples determined at 220 to adaptively interpolate additional points along the analog signal 160. In this way, the signal processor 100 adaptively interpolates the points to refine a region between the points between which the crossing point 315 occurs.

Furthermore, in one embodiment, the signal processor 100 uses other samples in addition to the two samples. For example, depending on a type of interpolation (e.g., 4 pt. Hermite interpolation, spline Interpolation, etc.) employed by the signal processor 100, a different number of points may be used for each iteration of the interpolation. Accordingly, the signal processor 100 may use not only the two samples that are adjacent to the crossing point but also other samples that are further from the crossing point for a first round of interpolating. In this way, points interpolated by the signal processor 100 have a greater accuracy.

Figure 4:
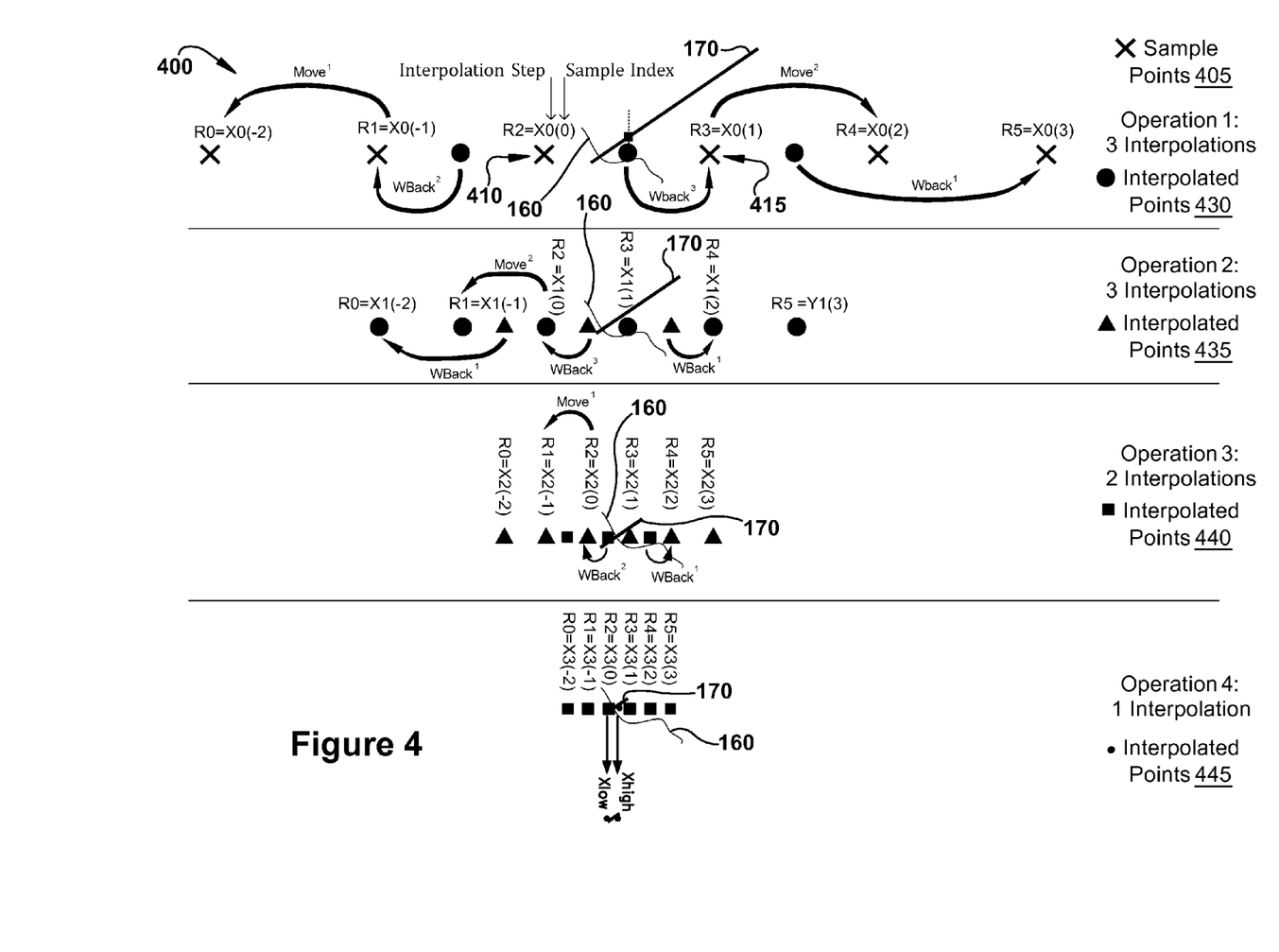
FIG. 4 illustrates one example of interpolating along an analog signal illustrated with multiple iterations of the interpolating.

For example, FIG. 4 illustrates multiple adaptive interpolation operations 400. Sample points 405 are the samples from 210 of the method 200. The two samples, $X_{low}$ 410 and $X_{high}$ 415, are the two adjacent samples along the analog signal 160 that are nearest to the crossing point with the reference signal 170. At interpolation operation 1, four of the sample points 405 are used, including the two adjacent samples 410 and 415 to produce interpolated points 430. In other embodiments, more of the sample points 405 are used or, for example, only the two adjacent samples 410 and 415 are used depending on a type of interpolation implemented. FIG. 4 illustrates a four point Hermite interpolation. Accordingly, each interpolation operation 1-4 uses four points as input to interpolate each additional point. The input points, for example, in the first operation 430 are all sample points 405 from 210 of the method 200. However, operations 2-4 may primarily use interpolated points from a previous operation. That is, the operations 2-4 may use one or more of the sample points 405 if for example, those sample points are closer to the crossing point than interpolated points from a previous operation. For example, the signal processor 100 adaptively selects points to store for a next interpolation operation by moving points between buffers and by storing interpolated points into buffers if for example, the new interpolated points are closer than the samples and any previously interpolated points. In this way, the signal processor 100 uses less storage space when adaptively interpolating. Of course, a number of buffers implemented can vary depending on a type of interpolation performed. In general, the operations 2-4 primarily use interpolated points (e.g., 430-440) from previous operations, however, if, for example, the interpolated points do not improve (e.g., closer) over previous points, then the signal processor 100 adaptively selects the closer points over other points when saving points for interpolating to avoid saving points that do not refine the region.

For example, operation 1 interpolates three new points 430 by using four of the sample points 405 for each interpolation. Operation 2 uses three of the original samples points 405 and the three interpolated points 430 from operation 1 to interpolate another three new points 435. FIG. 4 illustrates arrows between points at each operation 1-4 to show how points are adaptively moved/overwritten between buffers of the signal processor 100 in order to save points for a next operation while points which are further from the crossing point are discarded. In this way, the signal processor 100 can prevent use of interpolated points or sample points that are further from the crossing point than other points and not waste resources on storing points that do not improve refining the region.

At operation 3, the signal processor 100 uses the three points 435 from operation 2 as well as other points (e.g., previously interpolated points and/or sample points) to interpolate two points 440. At operation 3, only two interpolations occur even though three points are shown. Only two points are interpolated while three are shown because as the signal processor 100 refines a region in which the crossing point occurs, only those points on one side of a closest point are interpolated. That is, for example, if a closest point is to the left of the reference signal 170 then only points to the right of the closest point are interpolated since points to the left of the closest point will be further from the reference signal 170. In this way, the signal processor 100 adaptively interpolates to focus interpolating on a region directly around the crossing point. Additionally, by focusing the interpolating in this way a number of calculations can be reduced thereby improving efficiency of interpolating.

At operation 4, the signal processor 100 only interpolates one point for similar reasons as in operation 3. Points 445 result from the interpolation 400 and define outrebounds of a refined region within which the crossing point occurs. In this way, the signal processor 100 defines the refined region using an efficient number of calculations and an efficient amount of storage space by adaptively storing, for example, interpolated/sampled points only when they are useful for a next round of interpolating and by adaptively focusing interpolating operations toward a region of the crossing point to improve a number of calculations.

Continuing with the method 200 of FIG. 2, at 240, the signal processor 100 searches within the refined region as defined by the points 445. The signal processor 100 produces an estimated location of the crossing point by searching between the interpolated points from 230.

Figure 5:
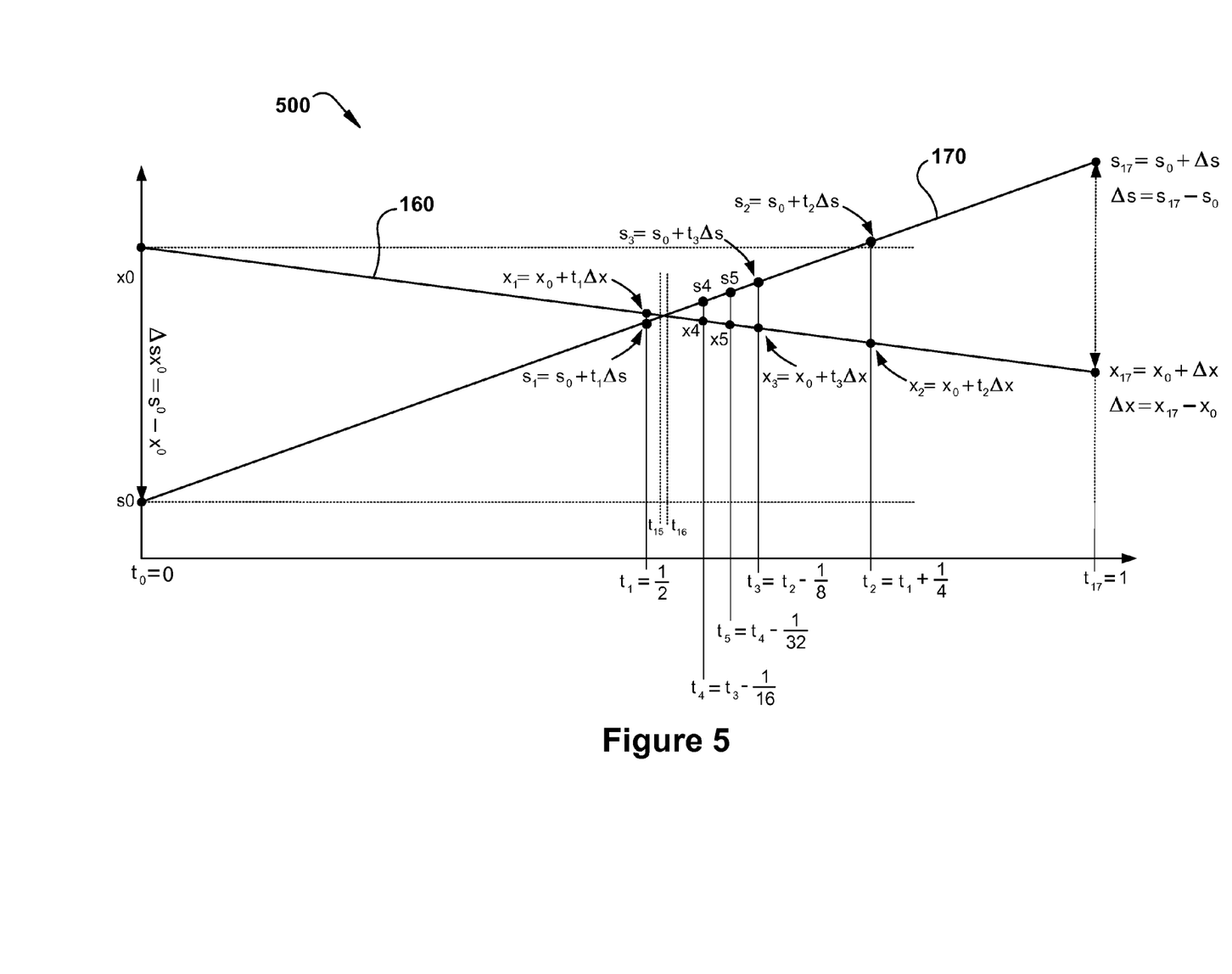
FIG. 5 illustrates one example of searching between interpolated points as illustrated on a plot of an analog signal and a reference signal.

Consider FIG. 5, which illustrates a plot 500 of the refined region determined at 230 and as defined by the two points that result from 230. In FIG. 5, x0 is Xlow and x17 is Xhigh from 230. That is, x0 is a point along the analog signal 160 that is closest on a left side of the reference signal 170, and x17 is a point on the analog signal 160 that is closest on a right side of the reference signal 170, as determined at 230. Accordingly, FIG. 5 illustrates a binary search with sixteen iterations that occur between Xlow and Xhigh. The binary search illustrated in FIG. 5 estimates a location of the crossing point (i.e., the NASP). The binary search illustrated in FIG. 5 operates according to the following: (Note that "sign" is used in the following equations to denote polarity and not the trigonometric function sine)

$$\Delta sx_i = s_i - x_i \quad (4)$$

$$\Delta sx_i = s_i - x_i \quad (5)$$
$$= s_0 + \frac{\Delta_s}{2} - x_0 - \frac{\Delta_x}{2}$$
$$= \Delta sx_0 + \frac{\Delta s - \Delta x}{2}$$

$$\text{for } (i = 1 \ldots 16) \left\{ t_i = t_{i-1} + \text{sign}(\Delta sx_0 * \Delta sx_{i-1}) * \frac{1}{2^i}, \right. \quad (6)$$
$$\left. \Delta sx_i = \Delta sx_{i-1} + \text{sign}(\Delta sx_0 * \Delta sx_{i-1}) * \frac{\Delta s - \Delta x}{2^i} \right\}$$

Equation (6) illustrates a loop executed by the signal processor 100 to perform the binary search. Four example iterations of the loop are shown below:

$$i = 1 \quad t_1 = t_0 + \text{sign}(\Delta sx_0 * \Delta sx_0) * \frac{1}{2^1},$$
$$\Delta sx_1 = \Delta sx_0 + \text{sign}(\Delta sx_0 * \Delta sx_0) * \frac{\Delta s - \Delta x}{2^1} \right\}$$

$$i = 2 \quad t_2 = t_1 + \text{sign}(\Delta sx_0 * \Delta sx_1) * \frac{1}{2^2},$$
$$\Delta sx_2 = \Delta sx_1 + \text{sign}(\Delta sx_0 * \Delta sx_1) * \frac{\Delta s - \Delta x}{2^2} \right\}$$

$$i = 3 \quad t_3 = t_2 + \text{sign}(\Delta sx_0 * \Delta sx_2) * \frac{1}{2^3},$$
$$\Delta sx_3 = \Delta sx_2 + \text{sign}(\Delta sx_0 * \Delta sx_2) * \frac{\Delta s - \Delta x}{2^3} \right\}$$

$$i = 4 \quad t_4 = t_3 + \text{sign}(\Delta sx_0 * sx_3) * \frac{1}{2^4},$$
$$\Delta sx_4 = \Delta sx_3 + \text{sign}(\Delta sx_0 * \Delta sx_3) * \frac{\Delta s - \Delta x}{2^4} \right\}$$

The binary search, as shown in FIG. 5, is performed sixteen times by the signal processor 100. In general, the signal processor 100 performs the binary search until, for example, reaching a predetermined number of iterations or until a result of the search is within a predetermined distance of the crossing point. An estimated location of the crossing point in FIG. 5 is given by the following:

While FIG. 5 illustrate a binary search, of course, the signal processor 100 may implement other searches to generate the estimated location of the crossing point. For example, the signal processor 100 can implement a dichotomic search or other search algorithm that is designed to search within a specified location of a plot of two signals to find an intersection point.

Continuing with the method 200 of FIG. 2, at 250, signal processor 100 generates a pulse in a pulse train of the PWM signal 110 as a function of the estimated location of the crossing point. In one embodiment, the signal processor 100 generates the pulse with a width that is based on the estimated location of the crossing point. For example, the signal processor 100 generates the pulse beginning at a beginning point of a period of the reference signal 170. The signal processor 100 maintains the pulse until, for example, reaching the estimated location of the crossing point in the period of the reference signal 170. In this way, the signal processor 100 generates the pulse with a width that is a function of where the estimated location of the crossing point occurs. In one embodiment, the signal processor 100 generates pulses in the PWM signal 110 according to a three-level pulse-width modulation or other pulse-width modulation scheme. Thus, pulses of the PWM signal 110 can have a positive or negative amplitude.

Figure 6:
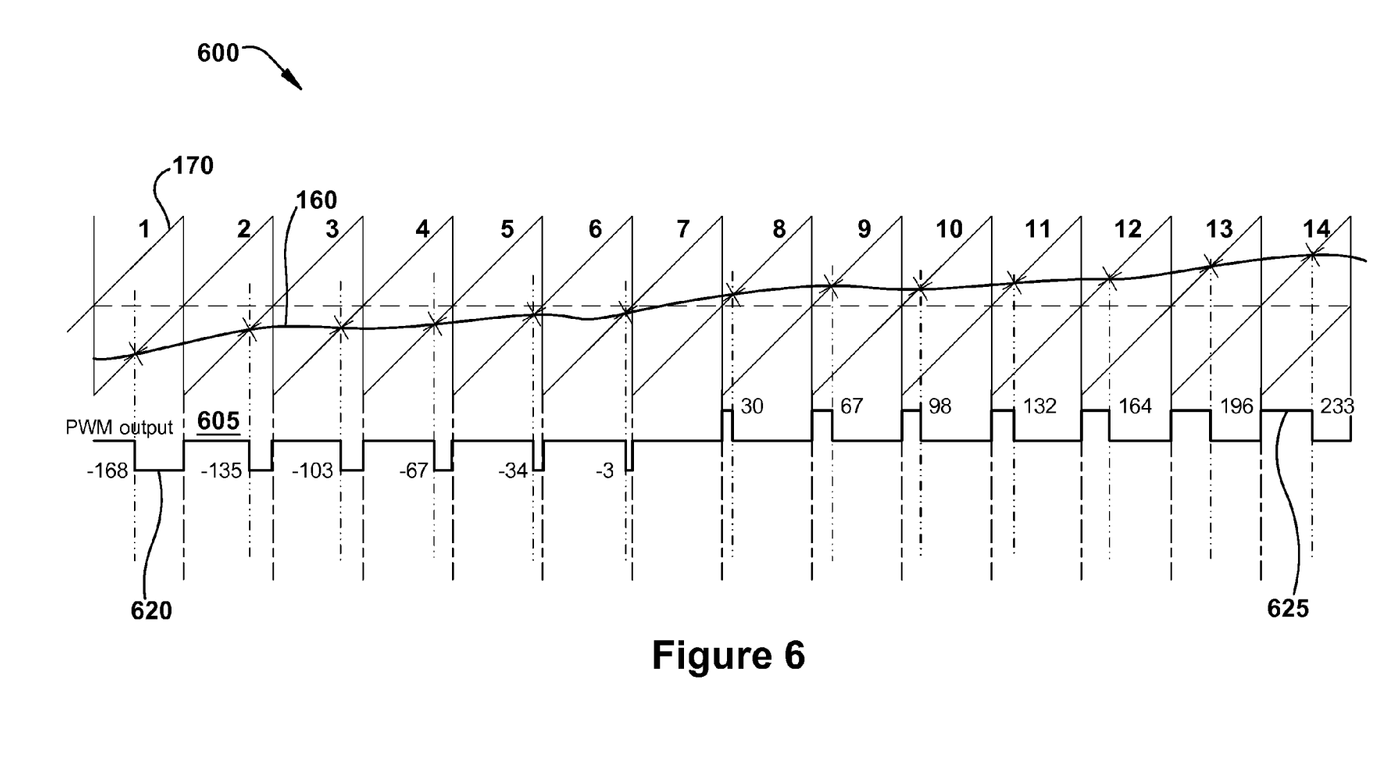
FIG. 6 illustrates a comparison of a PWM output against a plot of an analog signal and a reference signal.

FIG. 6 illustrates one example of a plot 600 of the analog signal 160 and the reference signal 170. In FIG. 6, a PWM output 605 (e.g, the PWM signal 110) is generated by the signal processor 100 in accordance with a three-level PWM scheme. For example, the signal processor 100 generates the PWM output 605 to have a negative value (e.g., pulse 620) when the analog signal 160 is below a predefined amplitude (e.g., <0) and to have a positive value (e.g., pulse 625) when the analog signal 160 has an amplitude above the predefined amplitude (e.g., >0).

Figure 7:
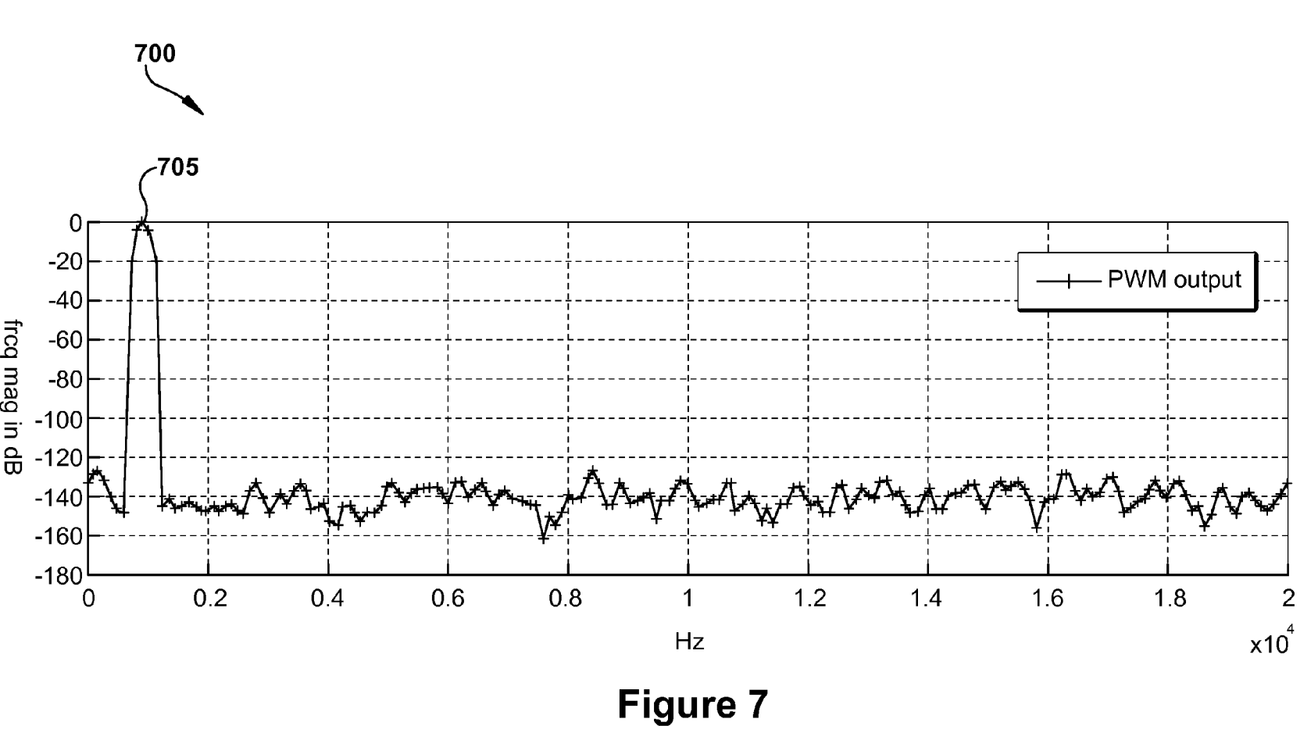
FIG. 7 illustrates a plot of a PWM output in the amplitude and frequency domains.

In this way, the signal processor 100 produces an accurate digital version of the analog signal 160 without producing, for example, intermodulation spectral distortion. For example, FIG. 7 illustrates a plot 700 of a PWM output 705 (e.g., the PWM signal 110) in the amplitude (y-axis) and frequency (x-axis) domains. As shown in FIG. 7, there are no adjacent bands to the PWM output 705. This is because the PWM output 705 is generated by the signal processor 100 and there is no distortion and thus no other bands on the plot 700.

Figure 8:
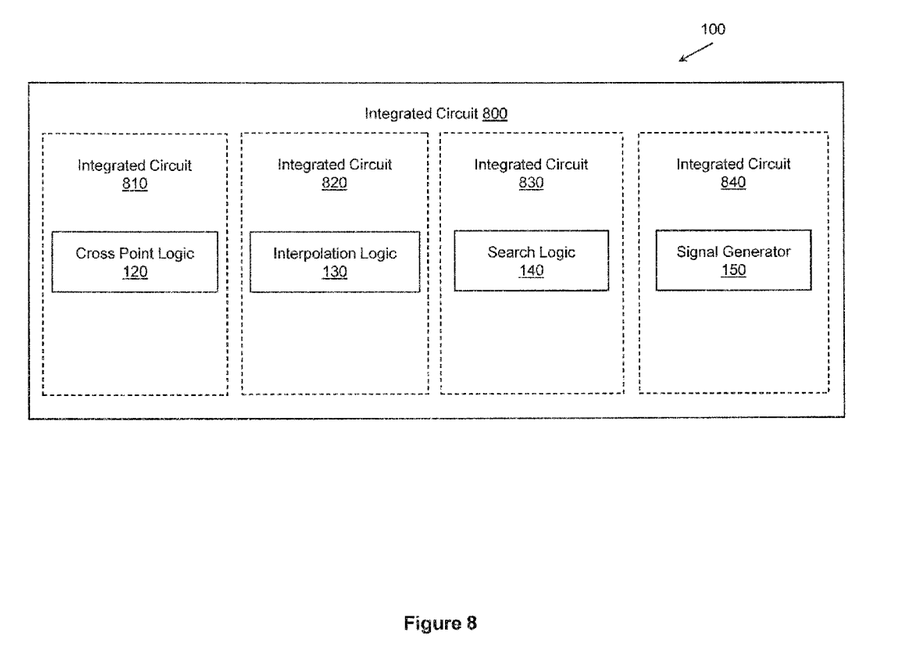
FIG. 8 illustrates one embodiment of an integrated circuit associated with estimating a natural sampling point from uniform sample points when generating a PWM signal.

FIG. 8 illustrates an additional embodiment of the signal processor 100 from FIG. 1 that is configured with separate integrated circuits and/or chips. In this embodiment, the cross point logic 120 from FIG. 1 is embodied as a separate integrated circuit 810. Additionally, the interpolation logic 130, the search logic 140, and the signal generator 150 are embodied as separate integrated circuits 820-840. The integrated circuits 810-840 are connected via connection paths to communicate signals. While integrated circuits 810, 820, 830 and 840 are illustrated as separate integrated circuits, they may be integrated into a common integrated circuit board 800. Additionally, integrated circuits 810, 820, 830, and 840 may be combined into fewer integrated circuits or divided into more integrated circuits than illustrated. Additionally, in another embodiment, the cross point logic 120, the interpolation logic 130, and the search logic 140 illustrated in integrated circuits 810, 820, and 830 may be combined into a separate application specific integrated circuit (ASIC). In other embodiments, portions of the functionality associated with the cross point logic 120, the interpolation logic 130, and the search logic 140 may be embodied as firmware executable by a processor and stored in a non-transitory memory.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes a computer or electrical hardware component(s), firmware, a non-transitory computer readable medium that stores instructions, and/or combinations of these components configured to perform a function(s) or an action(s), and/or to cause a function or action from another logic, method, and/or system. Logic may include a microprocessor controlled by an algorithm to perform one or more of the disclosed functions/methods, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic component. Similarly, where a single logic component is described, it may be possible to distribute that single logic component between multiple physical logic components. In some embodiments, one or more of the components and functions described herein are implemented using one or more of the logic components.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus for generating a pulse width modulation (PWM) signal using samples of an analog signal, comprising:
cross point logic configured to determine which of the samples along the analog signal are adjacent to a crossing point of a reference signal with the analog signal by identifying adjacent samples of the samples between which the crossing point occurs, wherein the crossing point is a point where the analog signal intersects the reference signal, wherein the crossing point is not a zero crossing point, wherein the samples are samples of the analog signal,
wherein identifying the adjacent samples includes identifying the adjacent samples by comparing the samples with the reference signal and determining when a change in polarity in values produced from the comparisons occurs;
an interpolation logic configured to adaptively interpolate points between the adjacent samples along the analog signal that approach the crossing point by using the adjacent samples as a starting boundary for a region when adaptively interpolating the points, wherein the interpolation logic is configured to adaptively interpolate the points to iteratively refine the region within which the crossing point occurs;

search logic configured to search within the region refined from adaptively interpolating the points to produce an estimated location of the crossing point by using the interpolated points; and a signal generator configured to generate a pulse in a pulse train of the PWM signal as a function of the estimated location of the crossing point.

2. The apparatus of claim 1, wherein the signal generator is configured to generate the pulse by generating the pulse with a width that is based on the estimated location of the crossing point and wherein the signal generator is configured to generate each subsequent pulse in the pulse train according to a subsequently estimated location of a different crossing point between the reference signal and the analog signal.

3. The apparatus of claim 1, wherein the search logic is configured to search the region using a binary search algorithm to produce the estimated location, wherein the search logic is configured to perform the binary search algorithm by iteratively bisecting the region to progressively refine the region and generate additional points that define the refined region and approach the crossing point.

4. The apparatus of claim 1, wherein the interpolation logic is configured to interpolate the points by iteratively interpolating a plurality of points until the points are within a predetermined distance of the crossing point.

5. The apparatus of claim 1, wherein the cross point logic is configured to sample the analog signal at a uniform interval to generate the samples, wherein the estimated location of the crossing point is an estimate of a natural sampling point (NASP) of the analog signal.

6. The apparatus of claim 1, wherein the interpolated points include two sample points along the analog signal that are on opposite sides of the reference signal and are located within a predetermined distance of the crossing point.

7. The apparatus of claim 1, wherein the signal generator is configured to generate the PWM signal by generating the PWM signal using uniform PWM sampling to determine a natural sampling point of the analog signal, and wherein the analog signal is an audio signal.

8. A method for generating a pulse width modulation (PWM) signal using samples of an analog signal, the method comprising:
    determining, by a signal processor, which of the samples along the analog signal are adjacent to a crossing point of a reference signal with the analog signal by identifying adjacent samples of the samples between which the crossing point occurs, wherein the crossing point is a point where the analog signal intersects the reference signal wherein the crossing point is not a zero crossing point,
    wherein identifying the adjacent samples includes identifying the adjacent samples by comparing the samples with the reference signal and determining when a change in polarity in values produced from the comparisons occurs;
    adaptively interpolating points between the adjacent samples along the analog signal that approach the crossing point by using the adjacent samples as a starting boundary for a region within which to adaptively interpolate the points, wherein adaptively interpolating the points refines the region within which the crossing point occurs;
    searching within the region to produce an estimated location of the crossing point by using the interpolated points; and
    generating a pulse in a pulse train of the PWM signal as a function of the estimated location of the crossing point.

9. The method of claim 8, wherein generating the pulse includes generating the pulse with a width that is based on the estimated location of the crossing point, and wherein generating the pulse in the pulse train includes generating each subsequent pulse in the pulse train according to a subsequently estimated location of a different crossing point between the reference signal and the analog signal.

10. The method of claim 8, wherein searching includes searching the region using a binary search algorithm to produce the estimated location, wherein searching includes performing the binary search by iteratively bisecting the region to progressively refine the region and generate additional points that define the refined region and approach the crossing point.

11. The method of claim 8, wherein adaptively interpolating the points includes iteratively interpolating a plurality of points until interpolating the points that are within a predetermined distance of the crossing point.

12. The method of claim 8, further comprising:
    sampling the analog signal at a uniform interval to generate the samples, wherein the estimated location of the crossing point is an estimate of a natural sampling point (NASP) of the analog signal.

13. The method of claim 8, wherein the interpolated points include two sample points along the analog signal that are on opposite sides of the reference signal and are located within a predetermined distance of the crossing point.

14. The method of claim 8, wherein generating the PWM signal includes generating the PWM signal using uniform PWM sampling to determine a natural sampling point of the analog signal.

15. The method of claim 8, wherein the signal processor receives the reference signal as a saw-tooth carrier waveform and receives the analog signal as an audio signal.

16. A non-transitory computer-readable medium storing computer executable instructions that when executed by a computer cause the computer to perform a method, the method comprising:
    analyzing samples of an analog signal;
    adaptively interpolating, by a signal processor in the computer, points along the analog signal that approach a crossing point where the analog signal intersects a reference signal, wherein adaptively interpolating the points successively generates additional points along the analog signal that approach the crossing point,
    wherein adaptively interpolating the points uses adjacent samples selected from the samples to initially define a region within which the crossing point occurs and the additional points are generated to refine the region where the crossing point occurs, wherein the crossing point is not a point where the analog signal crosses a zero value axis; and
    searching within the region refined from adaptively interpolating to produce an estimated location of the crossing point by using the interpolated points, and wherein searching with the region includes bisecting the region to iteratively refine bounds of the region when generating the estimated location.

17. The non-transitory computer-readable medium of claim 16,
    determining, by the signal processor, which of the samples along the analog signal are adjacent to the crossing point of the reference signal with the analog signal by comparing the samples with the reference signal and determining when a change in polarity in values produced from the comparisons occurs.

18. The non-transitory computer-readable medium of claim 16, further comprising:
generating, by the signal processor, a pulse in a pulse train of a pulse-width modulation (PWM) signal as a function of the estimated location of the crossing point, wherein generating the pulse includes generating each subsequent pulse in the pulse train according to an estimated location of a different crossing point.

19. The non-transitory computer-readable medium of claim 16, further comprising:
sampling, prior to adaptively interpolating the points, the analog signal at a uniform interval to generate the samples.

20. The non-transitory computer-readable medium of claim 16, wherein the estimated location of the crossing point is an estimate of a natural sampling point (NASP) of the analog signal.

\* \* \* \* \*